United States Patent
Li et al.

(10) Patent No.: US 11,569,159 B2
(45) Date of Patent: Jan. 31, 2023

(54) STRUCTURE AND FORMATION METHOD OF CHIP PACKAGE WITH THROUGH VIAS

(71) Applicant: Taiwan Semiconductor Manufacturing Co., Ltd., Hsinchu (TW)

(72) Inventors: Ling-Wei Li, Hsinchu (TW); Jung-Hua Chang, Hsinchu (TW); Cheng-Lin Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/893,119

(22) Filed: Jun. 4, 2020

(65) Prior Publication Data
US 2021/0066179 A1    Mar. 4, 2021

Related U.S. Application Data

(60) Provisional application No. 62/894,329, filed on Aug. 30, 2019.

(51) Int. Cl.
*H01L 23/498* (2006.01)
*H01L 21/48* (2006.01)
(Continued)

(52) U.S. Cl.
CPC ...... *H01L 23/49827* (2013.01); *H01L 21/486* (2013.01); *H01L 21/4853* (2013.01);
(Continued)

(58) Field of Classification Search
CPC . H01L 23/49827; H01L 21/486; H01L 21/56; H01L 21/4853; H01L 23/49838;
(Continued)

(56) References Cited

U.S. PATENT DOCUMENTS 6,469,394 B1 * 10/2002 Wong ............... H05K 3/3436
257/780
7,808,095 B2 * 10/2010 Jung ............... H01L 25/105
257/686
(Continued)

FOREIGN PATENT DOCUMENTS

| TW | 200721514 A | 6/2007 |
| TW | 200937599 A | 9/2009 |
| TW | 201838111 A | 10/2018 |

*Primary Examiner* — Vu A Vu
(74) *Attorney, Agent, or Firm* — Birch, Stewart, Kolasch & Birch, LLP

(57) ABSTRACT

A package structure and a formation method of a package structure are provided. The method includes forming a conductive structure over a carrier substrate. The conductive structure has a lower portion and an upper portion, and the upper portion is wider than the lower portion. The method also includes disposing a semiconductor die over the carrier substrate. The method further includes forming a protective layer to surround the conductive structure and the semiconductor die. In addition, the method includes forming a conductive bump over the conductive structure. The lower portion of the conductive structure is between the conductive bump and the upper portion of the conductive structure.

20 Claims, 15 Drawing Sheets

(51) Int. Cl.
*H01L 21/56* (2006.01)
*H01L 23/31* (2006.01)
*H01L 21/683* (2006.01)
*H01L 25/10* (2006.01)

(52) U.S. Cl.
CPC .......... *H01L 21/56* (2013.01); *H01L 21/6835* (2013.01); *H01L 23/3128* (2013.01); *H01L 23/49816* (2013.01); *H01L 23/49838* (2013.01); *H01L 25/105* (2013.01); *H01L 2221/68345* (2013.01); *H01L 2221/68359* (2013.01); *H01L 2225/1023* (2013.01); *H01L 2225/1058* (2013.01)

(58) Field of Classification Search
CPC ............. H01L 23/3128; H01L 21/6835; H01L 23/49816; H01L 2221/68359; H01L 25/105; H01L 2225/1023; H01L 2225/1058; H01L 2221/68345; H01L 21/568; H01L 2221/68372; H01L 2224/18
USPC ....................................................... 257/668
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,059,107 B2* | 6/2015 | Pan .................. H01L 21/6835 |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,508,674 B2* | 11/2016 | Pan ...................... H01L 24/19 |
| 9,899,248 B2* | 2/2018 | Yu .......................... H01L 24/20 |
| 10,304,697 B2* | 5/2019 | Balaraman ............. H01L 21/56 |
| 11,043,441 B2* | 6/2021 | Lee ...................... H01L 21/568 |
| 2016/0172198 A1* | 6/2016 | Schulte ............. H01L 21/0273 438/666 |

* cited by examiner

STRUCTURE AND FORMATION METHOD OF CHIP PACKAGE WITH THROUGH VIAS

PRIORITY CLAIM AND CROSS-REFERENCE

This Application claims the benefit of U.S. Provisional Application No. 62/894,329, filed on Aug. 30, 2019, the entirety of which is incorporated by reference herein.

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature sizes (i.e., the smallest component that can be created using a fabrication process) have decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which utilize less area or are lower in height, have been developed to package the semiconductor devices.

New packaging technologies have been developed to further improve the density and functionalities of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
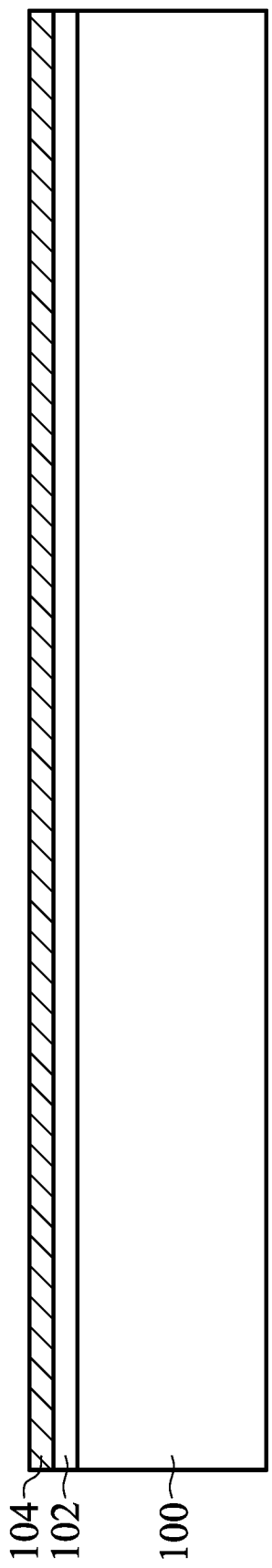
FIGS. 1A-1M are cross-sectional views of various stages of a process for forming a package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to three-dimensional (3D) packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1M are cross-sectional views of various stages of a process for forming a package structure, in accordance with some embodiments. As shown in FIG. 1A, a carrier substrate 100 is provided or received. In some embodiments, the carrier substrate 100 is used as a temporary support substrate that will be removed later. The carrier substrate 100 may be made of or include a semiconductor material, a ceramic material, a polymer material, a metal material, one or more other suitable materials, or a combination thereof. In some embodiments, the carrier substrate 100 is a glass substrate, such as a glass wafer. In some other embodiments, the carrier substrate 100 is a semiconductor substrate, such as a silicon wafer.

Afterwards, an adhesive layer 102 is formed or attached over the carrier substrate 100, as shown in FIG. 1A in accordance with some embodiments. The adhesive layer 102 may be made of or include glue, a lamination material, one or more other suitable materials, or a combination thereof. In some embodiments, the adhesive layer 102 is sensitive to an energy beam irradiation. In some embodiments, the adhesive layer 102 is a release layer that is made of or includes a light-to-heat conversion (LTHC) material. For example, a laser beam and/or an ultraviolet (UV) light may be used to irradiate the adhesive layer 102. After irradiation, the adhesive layer 102 may be easily detached from the carrier substrate 100. In some other embodiments, the adhesive layer 102 is heat-sensitive. The adhesive layer 102 may be detached using a thermal operation.

Afterwards, a seed layer 104 is deposited over the adhesive layer 102, as shown in FIG. 1A in accordance with some embodiments. The seed layer 104 may be made of or include a metal material. The seed layer 104 may be made of or include Ti, Ti alloy, Cu, Cu alloy, one or more other suitable materials, or a combination thereof. The Ti alloy or the Cu alloy may include silver, chromium, nickel, tin, gold, tungsten, one or more other suitable elements, or a combination thereof. In some embodiments, the seed layer 104 is a single layer. In some other embodiments, the seed layer 104 includes multiple sub-layers. The seed layer 104 may be deposited using a physical vapor deposition (PVD) process, a chemical vapor deposition (CVD) process, a spin coating process, an atomic layer deposition (ALD) process, one or more other applicable processes, or a combination thereof.

Figure 1B:
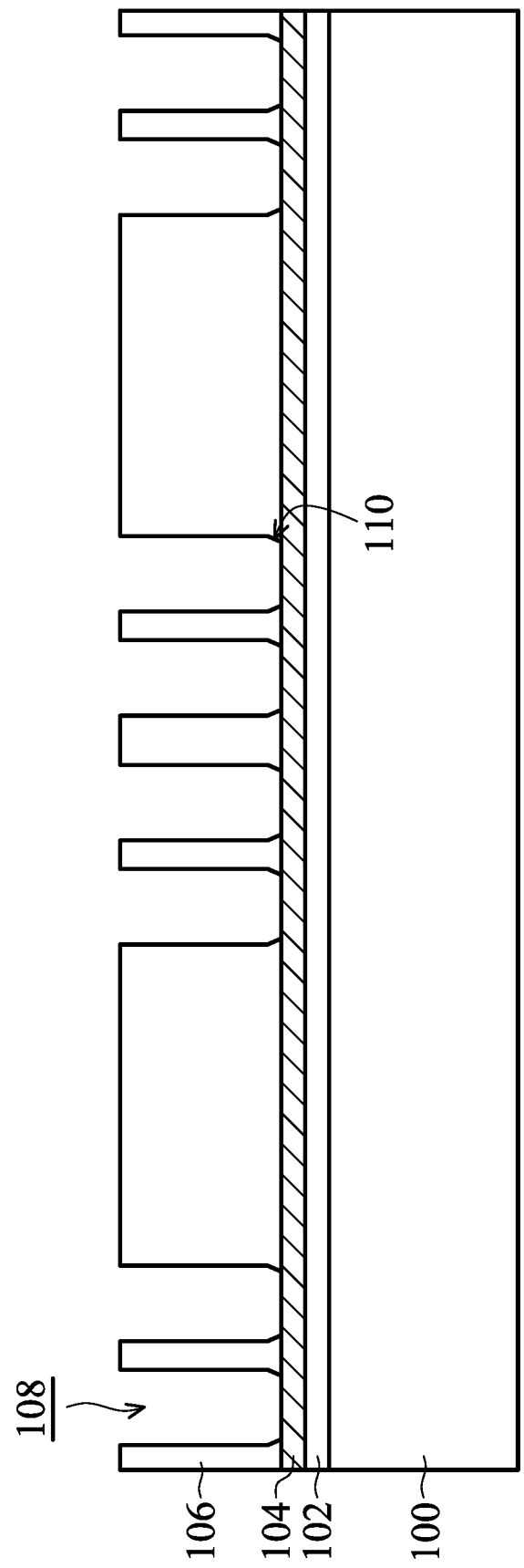

As shown in FIG. 1B, a photosensitive layer 106 is formed over the seed layer 104, in accordance with some embodiments. The photosensitive layer 106 has multiple openings 108 that expose portions of the seed layer 104. The openings 108 of the photosensitive layer 106 define the positions where conductive structures, such as through vias, will be formed. In some embodiments, the photosensitive layer 106 is made of or includes a photoresist material. The openings 108 of the photosensitive layer 106 may be formed using a photolithography process that includes an exposure operation and a development operation.

In some embodiments, the photosensitive layer 106 has footing structures 110 near the bottoms of the openings 108, as shown in FIG. 1B. Each of the openings 108 has a lower portion that is tapered along a direction towards the seed layer 104. In some embodiments, the lower portion of each of the openings 108 shrinks and is tapered along the direction towards the seed layer 104. Photoresist residue may remain near the lower portions of the unexposed portions and form the footing structures 110. The footing structures 110 may have inclined surfaces. In some other embodiments, the footing structures 110 have curved surfaces. A residue of photosensitive layer 106 remains near the lower portions of the unexposed regions producing the footing effect or other profile abnormalities. The footing structures 110 may result due to a loss of acid (or other composites) in the exposed regions after exposure and before development. Each of the footing structures 110 may extend outwardly from the respective sidewall of the photosensitive layer 106 by a distance that is in a range from about 0.1 µm to about 20 µm.

Figure 1C:
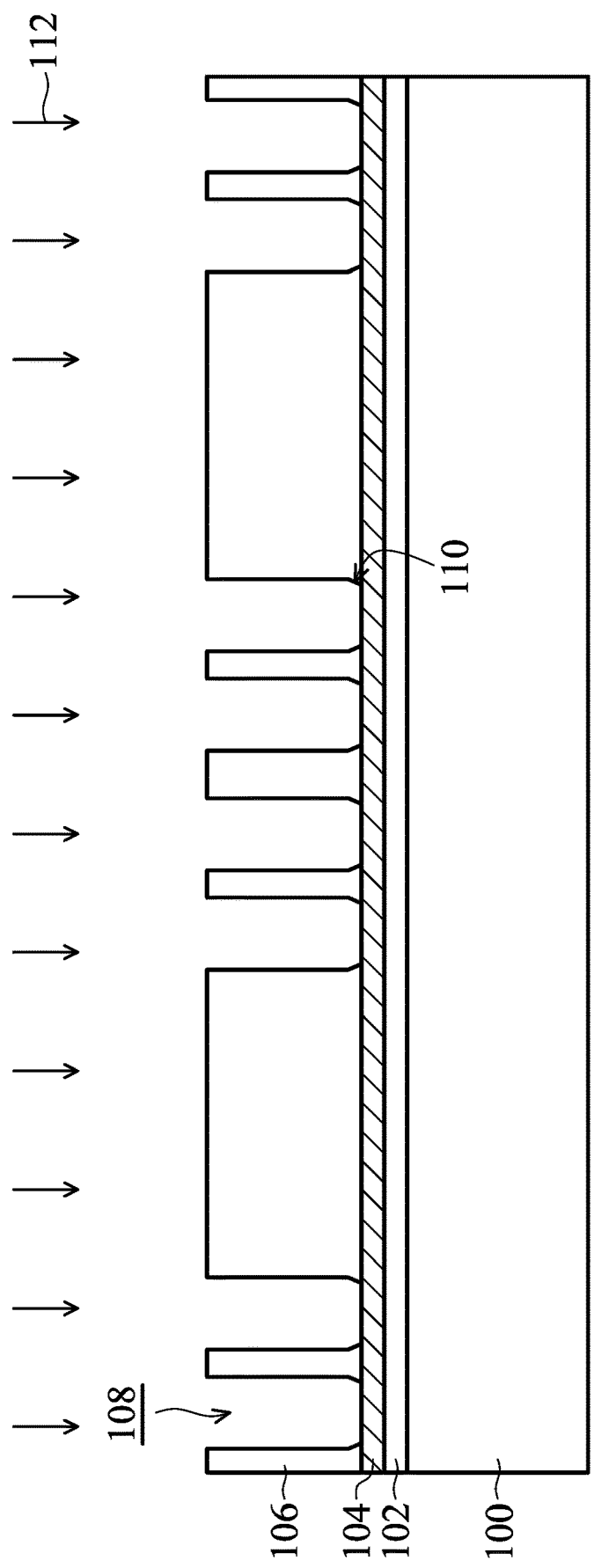

As shown in FIG. 1C, a plasma operation 112 is performed to clean and/or modify the surfaces of the photosensitive layer 106, in accordance with some embodiments. Due to the plasma operation 112, the sidewalls of the photosensitive layer 106 that define the openings 108 may be modified to be more hydrophilic, which facilitates a subsequent electroplating process for forming conductive structures in the openings 108. The electroplating liquid may enter the openings 108 more easily since the surfaces of the photosensitive layer 106 become more hydrophilic. The reaction gas used for generating the plasma in the plasma operation 112 may include $CF_4$, $O_2$, $N_2$, one or more other suitable gases, or a combination thereof.

However, embodiments of the disclosure are not limited thereto. Many variations and/or modifications can be made to embodiments of the disclosure. In some other embodiments, the plasma operation 112 is not performed.

Figure 1D:
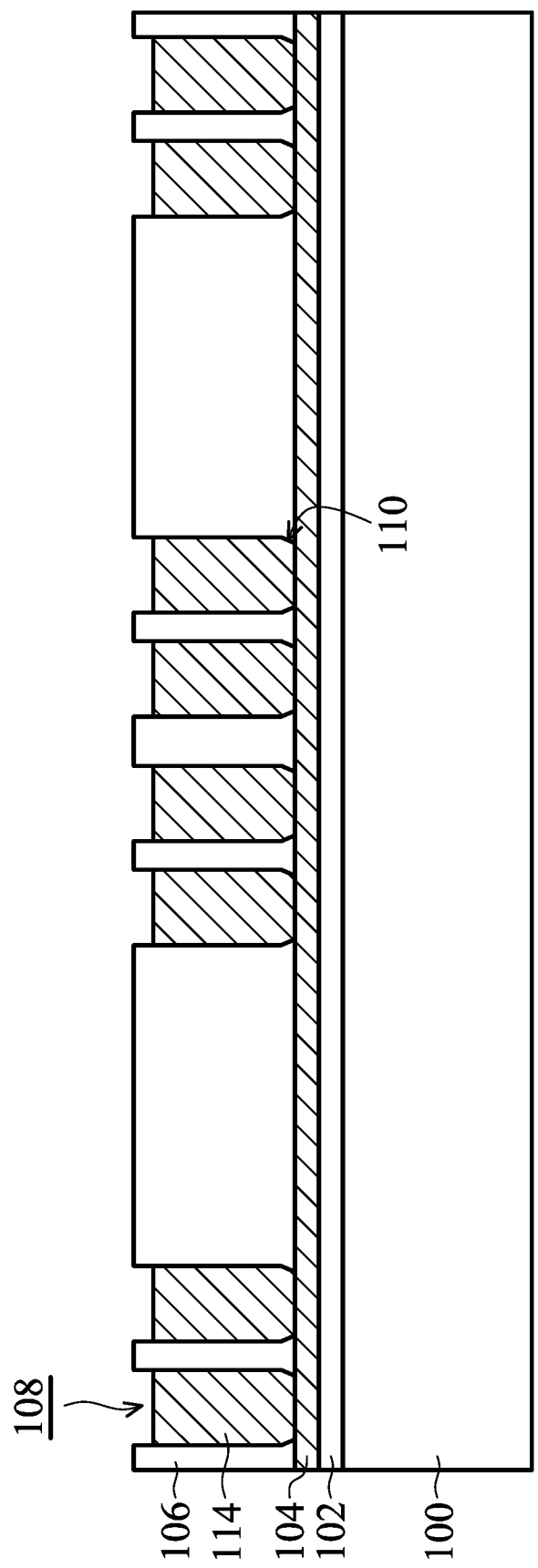

As shown in FIG. 1D, conductive structures 114 are formed in the openings 108, in accordance with some embodiments. The conductive structures 114 may be made of or include copper, cobalt, tin, titanium, gold, one or more other suitable materials, or a combination thereof. The conductive structures 114 may be formed using an electroplating process, an electroless plating process, one or more other applicable processes, or a combination thereof. A conductive material is plated on the exposed portions of the seed layer 104 so as to form the conductive structures 114.

In some embodiments, unlike some other regular processes for forming a patterned photoresist layer, there is no thermal baking operation performed after the formation of the opening shown in FIG. 1C and before the formation of the conductive structure shown in FIG. 1D. There is no thermal baking operation performed after the plasma operation 112 shown in FIG. 1C and before the formation of the conductive structures 114 shown in FIG. 1D. In some embodiments, during the processes illustrated in FIGS. 1C-1D, the workpiece is maintained at a constant operation temperature such as at the room temperature. The constant operation temperature may be in a range from about 15 degrees C. to about 30 degrees C. Since no thermal baking operation is performed, the shape and profile of the openings 108 may substantially be maintained without being changed during the formation of the conductive structures 114. The footing structures 110 of the photosensitive layer 106 are also maintained without being damaged due to any thermal baking operation.

In some embodiments, the upper portions of the openings 108 have substantially vertical sidewalls, as shown in FIGS. 1C and 1D. Therefore, the upper portions of the conductive structures 114 also have substantially vertical sidewalls. In some embodiments, the lower portions of the openings 108 gradually shrink due to the footing structures 110 of the photosensitive layer 106. Therefore, the lower portions of the conductive structures 114 also have profiles corresponding to the footing structures 110, as shown in FIGS. 1C and 1D.

Figure 1E:
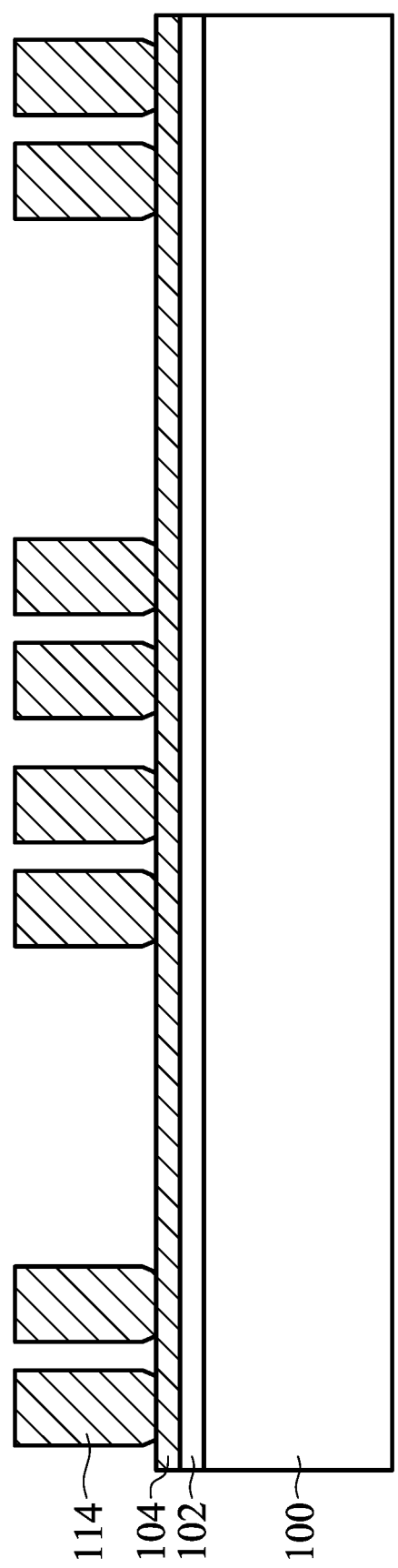

As shown in FIG. 1E, the photosensitive layer 106 is removed to expose the seed layer 104 and the sidewalls of the conductive structures 104, in accordance with some embodiments. A stripping operation and/or an ashing operation may be used to remove the photosensitive layer 106.

Afterwards, the portions of the seed layer 104 not covered by the conductive structures 114 are removed to expose the adhesive layer 102, in accordance with some embodiments.

Figure 1F:
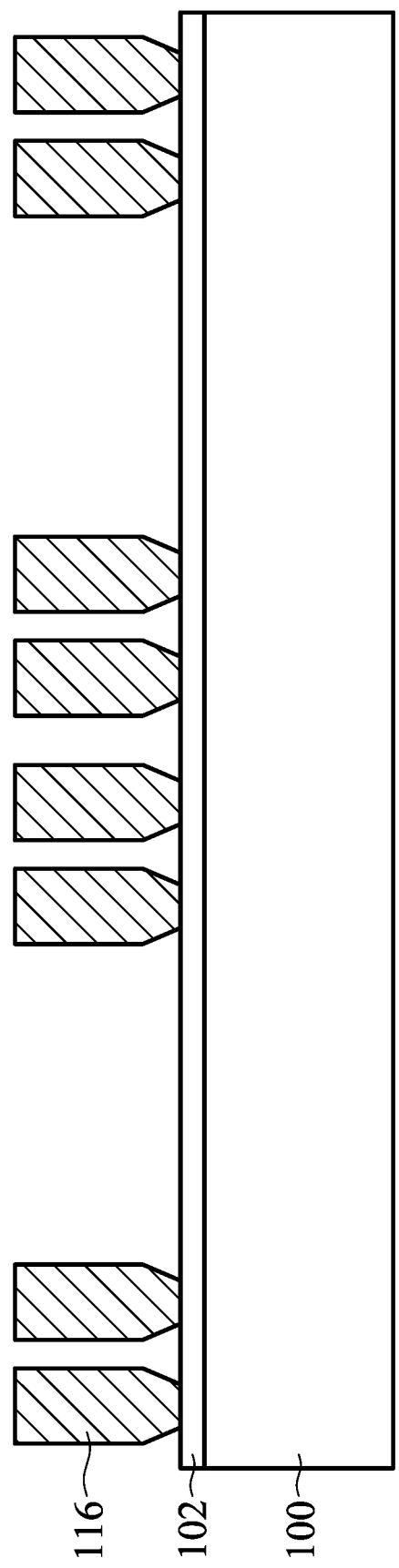

As a result, the remaining portions of the seed layer 104 and the conductive structures 114 integrally form conductive structures 116, as shown in FIG. 1F in accordance with some embodiments. An etching process (such as a wet etching process) may be used to partially remove the seed layer 104. Surface portions of the conductive structures 114 may also be etched during the etching process. In some embodiments, the etching process is a wet etching process. The remaining portions of the seed layer 104 may substantially follow the profile of the overlying conductive structures 116. In some other embodiments, the etching process is a dry etching process. The sidewalls of the remaining portions of the seed layer 104 may be substantially vertical.

Each of the conductive structures 116 has an upper portion and a lower portion, as shown in FIG. 1F. In some embodiments, the upper portion is wider than the lower portion. In some embodiments, the lower portion of the conductive structure 116 is tapered along a direction towards the bottom of the conductive structure 116. In some embodiments, the lower portion of the conductive structure 116 shrinks along a direction towards the bottom of the conductive structure 116. In some embodiments, the lower portion of the conductive structure 116 gradually shrinks along a direction towards the bottom of the conductive structure 116.

Figure 1G:
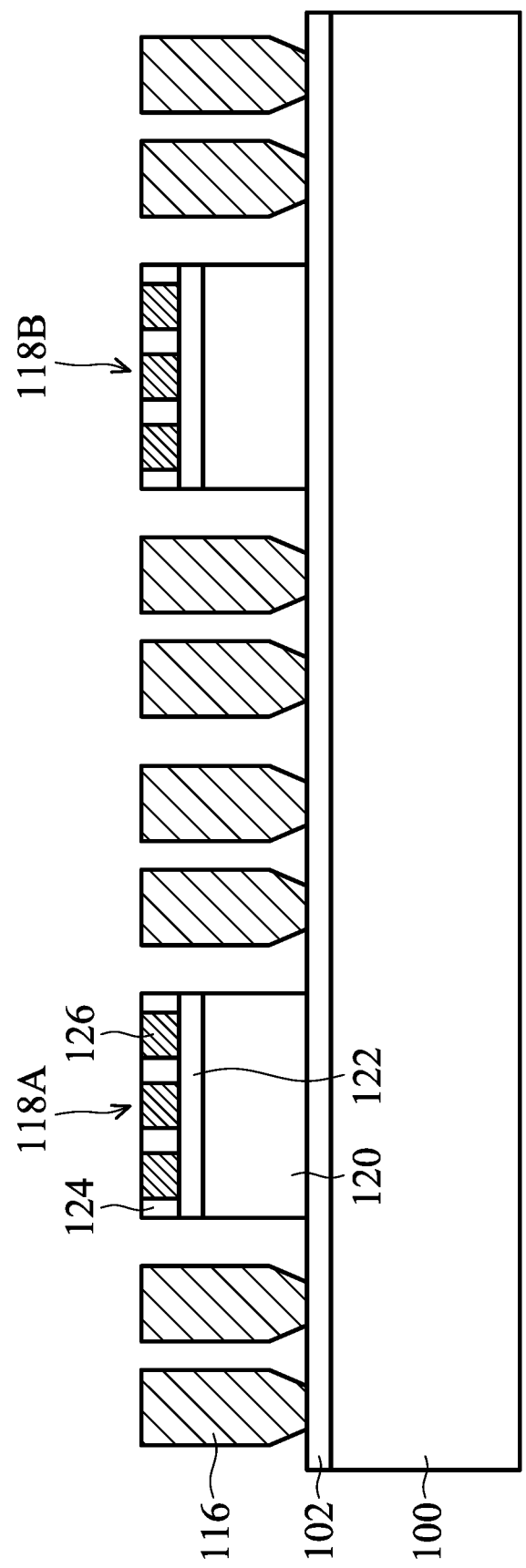

As shown in FIG. 1G, semiconductor dies 118A and 118B are disposed over the adhesive layer 102, in accordance with some embodiments. In some embodiments, the semiconductor die 118A or 118B is a system-on-chip (SoC) chip that includes multiple functions. In some embodiments, the back sides of the semiconductor dies 118A and 118B face the adhesive layer 102 with the front sides of the semiconductor dies 118A and 118B facing upwards. An adhesive film (not shown) may be used to fix the semiconductor dies 118A and 118B on the adhesive layer 102. The adhesive film may include a die attach film (DAF), a glue, or another suitable film. The semiconductor dies 118A and 118B may be disposed using a pick and place operation.

Each of the semiconductor dies 118A and 118B may include a semiconductor substrate 120, an interconnection structure 122, conductive pads 126 at the front side of the semiconductor die, and a passivation layer 124 surrounding the conductive pads 126. In some embodiments, the conductive pads 126 are conductive pillars, such as copper pillars. In some embodiments, various device elements are formed in and/or on the semiconductor substrate 120. Examples of the various device elements include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field effect transistors (PFETs/NFETs), etc.), diodes, or other suitable elements.

The device elements are interconnected to form integrated circuit devices through conductive features formed in the interconnection structure 122. The interconnection structure 122 may include multiple dielectric layers and multiple conductive features. The conductive features may include multiple conductive lines, conductive contacts, and conductive vias. The integrated circuit devices include logic devices, memory devices (e.g., static random access memories, SRAMs), radio frequency (RF) devices, input/output (I/O) devices, system-on-chip (SoC) devices, other applicable types of devices, or a combination thereof. In some embodiments, the semiconductor die 118A or 118B is a system-on-chip (SoC) chip that includes multiple functions.

The conductive pads 126 may be wider portions of some of the conductive lines formed on the interconnection structure 122. The conductive pads 126 may be partially embedded in the passivation layer 124. Each of the conductive pads 126 is electrically connected to one or more device elements through some of the conductive features in the interconnection structure 122. Therefore, the device elements in and/or on the semiconductor substrate 120 may be electrically connected to other elements through the conductive pads 126.

Figure 1H:
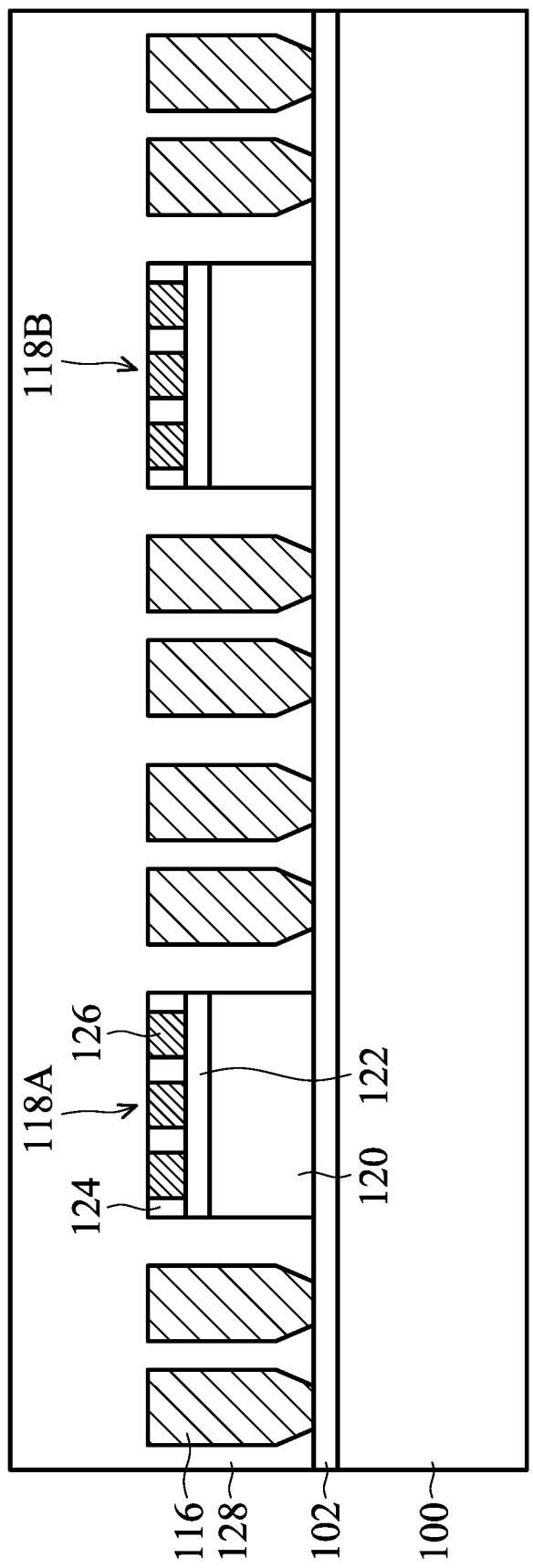

As shown in FIG. 1H, a protective layer 128 is formed over the carrier substrate 100 to surround and protect the semiconductor dies 118A and 118B and the conductive structures 116, in accordance with some embodiments. In some embodiments, the protective layer 128 is in direct contact with the lower portions and the upper portions of the conductive structures 116. In some embodiments, the protective layer 128 is made of or includes an insulating material such as a molding material. The molding material may include a polymer material, such as an epoxy-based resin with one or more fillers dispersed therein. The fillers may include insulating particles, insulating fibers, one or more other elements, or a combination thereof. For example, the fillers include silica particles, silica fibers, carbon-containing particles, carbon-containing fibers, one or more other fillers, or a combination thereof.

In some embodiments, a molding material (such as a liquid molding material) is introduced or injected to cover the conductive structures 116 and the semiconductor dies 118A and 118B. In some embodiments, a thermal operation is then used to cure the liquid molding material and to transform it into the protective layer 128.

Figure 1I:
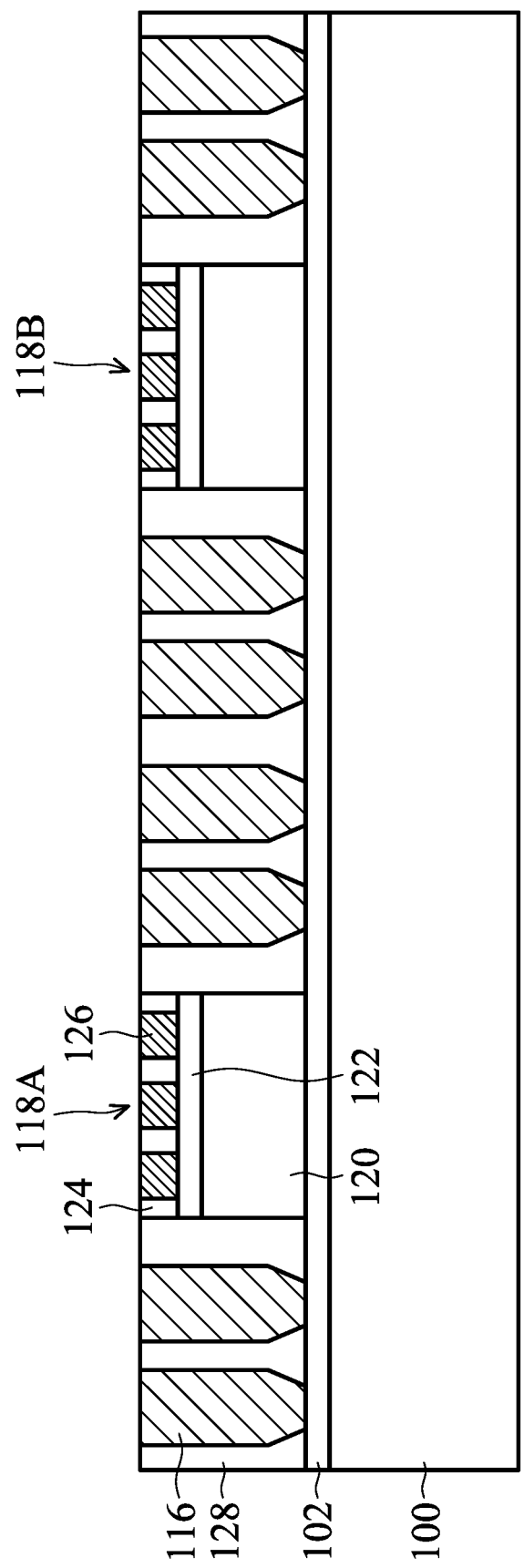

As shown in FIG. 1I, the protective layer 128 is planarized to reduce the thickness of the protective layer 128, in accordance with some embodiments. In some embodiments, the protective layer 128 is planarized to expose the conductive pads 126 of the semiconductor dies 118A and 118B and the conductive structures 116. The planarization of the protective layer 128 may be achieved using a mechanical grinding process, a chemical mechanical polishing (CMP) process, a dry polishing process, an etching process, one or more other applicable processes, or a combination thereof. In some embodiments, the conductive structures 116 and/or the semiconductor dies 118A and 118B are also partially removed during the planarization process. In some embodiments, the top surfaces of the conductive structures 116 and the semiconductor dies 118A and 118B are substantially level with each other.

Figure 1J:
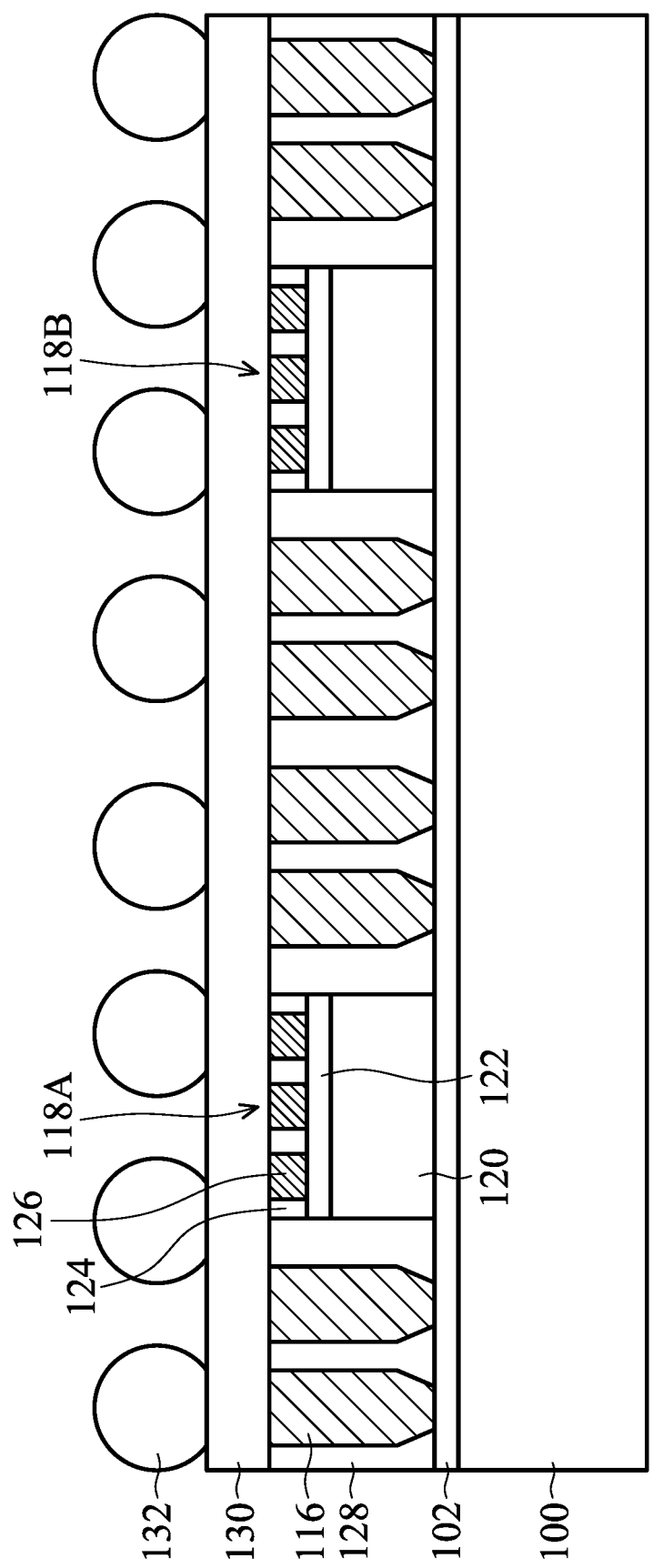

As shown in FIG. 1J, a redistribution structure 130 is formed over the structure shown in FIG. 1I, in accordance with some embodiments. The redistribution structure 130 is used for routing, which enables the formation of a package structure with fan-out features. In some embodiments, the redistribution structure 130 includes multiple insulating layers and multiple conductive features. The conductive features are surrounded by the insulating layers. The conductive features may include conductive lines, conductive vias, and/or conductive pads.

The redistribution structure 130 also includes conductive pads that are used to hold or receive other elements. In some embodiments, the conductive pads are exposed at or protrude from the topmost surface of the insulating layers. The conductive pads may be used to hold or receive one or more semiconductor dies and/or one or more passive elements. The conductive pads may also be used to hold or receive conductive features such as conductive pillars and/or conductive bumps. In some embodiments, the conductive pads are under bump metallization (UBM) pads.

The insulating layers of the redistribution structure 130 may be made of or include one or more polymer materials. The polymer material(s) may include polybenzoxazole (PBO), polyimide (PI), epoxy-based resin, one or more other suitable polymer materials, or a combination thereof. In some embodiments, the polymer material is photosensitive. A photolithography process may therefore be used to form openings with desired patterns in the insulating layers. These openings may be used to contain the conductive features and/or the conductive pads.

In some other embodiments, some or all of the insulating layers are made of or include dielectric materials other than polymer materials. The dielectric material may include silicon oxide, silicon carbide, silicon nitride, silicon oxynitride, one or more other suitable materials, or a combination thereof.

The conductive features may include conductive lines providing electrical connection in horizontal directions and conductive vias providing electrical connection in vertical directions. In some embodiments, some of the conductive vias are stacked with each other. The upper conductive via is substantially aligned with the lower conductive via. In some embodiments, some of the conductive vias are staggered vias. The upper conductive via is misaligned with the lower conductive via.

The conductive features and/or the conductive pads of the redistribution structure 130 may be made of or include copper, aluminum, gold, cobalt, titanium, nickel, silver, graphene, one or more other suitable conductive materials, or a combination thereof. In some embodiments, the conductive features include multiple sub-layers. For example, each of the conductive features contains multiple sub-layers including Ti/Cu, Ti/Ni/Cu, Ti/Cu/Ti, Al/Ti/Ni/Ag, other suitable sub-layers, or a combination thereof.

The formation of the redistribution structure 130 may involve multiple deposition or coating processes, multiple patterning processes, and/or multiple planarization processes.

The deposition or coating processes may be used to form insulating layers and/or conductive layers. The deposition or coating processes may include a spin coating process, an electroplating process, an electroless process, a CVD process, a PVD process, an ALD process, one or more other applicable processes, or a combination thereof.

The patterning processes may be used to pattern the formed insulating layers and/or the formed conductive layers. The patterning processes may include a photolithography process, an energy beam drilling process (such as a laser beam drilling process, an ion beam drilling process, or an electron beam drilling process), an etching process, a mechanical drilling process, one or more other applicable processes, or a combination thereof.

The planarization processes may be used to provide the formed insulating layers and/or the formed conductive layers with planar top surfaces to facilitate subsequent processes. The planarization processes may include a mechanical grinding process, a CMP process, a dry polishing process, an etching process, one or more other applicable processes, or a combination thereof.

Afterwards, conductive bumps 132 are formed over the redistribution structure 130, as shown in FIG. 1J in accordance with some embodiments. The conductive bumps 132 may be formed on the conductive pads. In some embodiments, the conductive bumps 132 are tin-containing solder bumps. The tin-containing solder bumps may further include copper, silver, gold, aluminum, lead, one or more other suitable materials, or a combination thereof. In some other embodiments, the conductive bumps 132 are lead-free. The conductive bumps 132 may be formed using a solder ball placement process and a thermal reflow process.

Figure 1K:
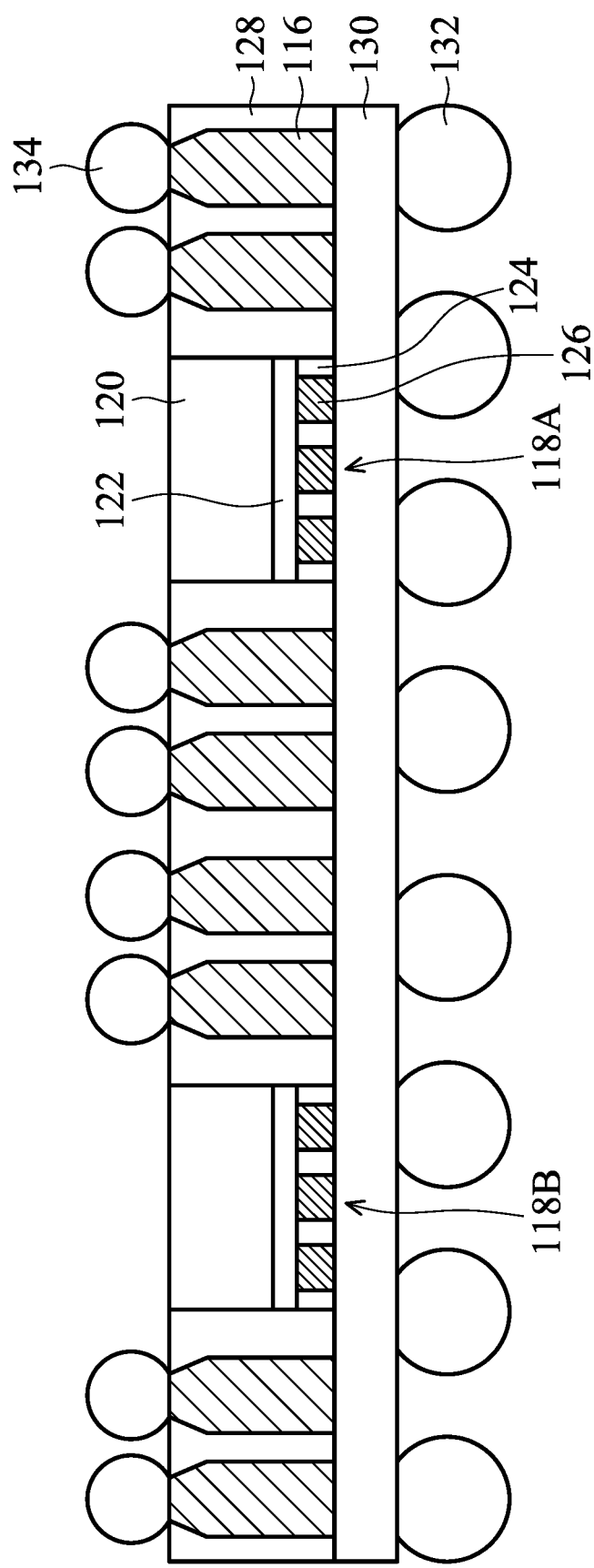

As shown in FIG. 1K, the structure shown in FIG. 1J is turned upside down, and the carrier substrate 100 and the adhesive layer 102 are removed, in accordance with some embodiments. The ends of the conductive structures 116 may be exposed after the removal of the carrier substrate 100 and the adhesive layer 102. Afterwards, conductive bumps 134 are formed over the conductive structures 116, as shown in FIG. 1K in accordance with some embodiments. In some embodiments, the conductive bumps 134 are formed directly on the conductive structures 116 that are exposed after the removal of the adhesive layer 102 and the carrier substrate 100. In some embodiments, the conductive bumps 134 are tin-containing solder bumps. The conductive bumps 134 are in direct contact with the conductive structures 116. In some embodiments, each of the conductive structures 116 has a top that is substantially as large as the bottom of the conductive bump 134 directly on the corresponding conductive structure 116. The material and formation method of the conductive bumps 134 may be the same as or similar to those of the conductive bumps 132.

Figure 2:
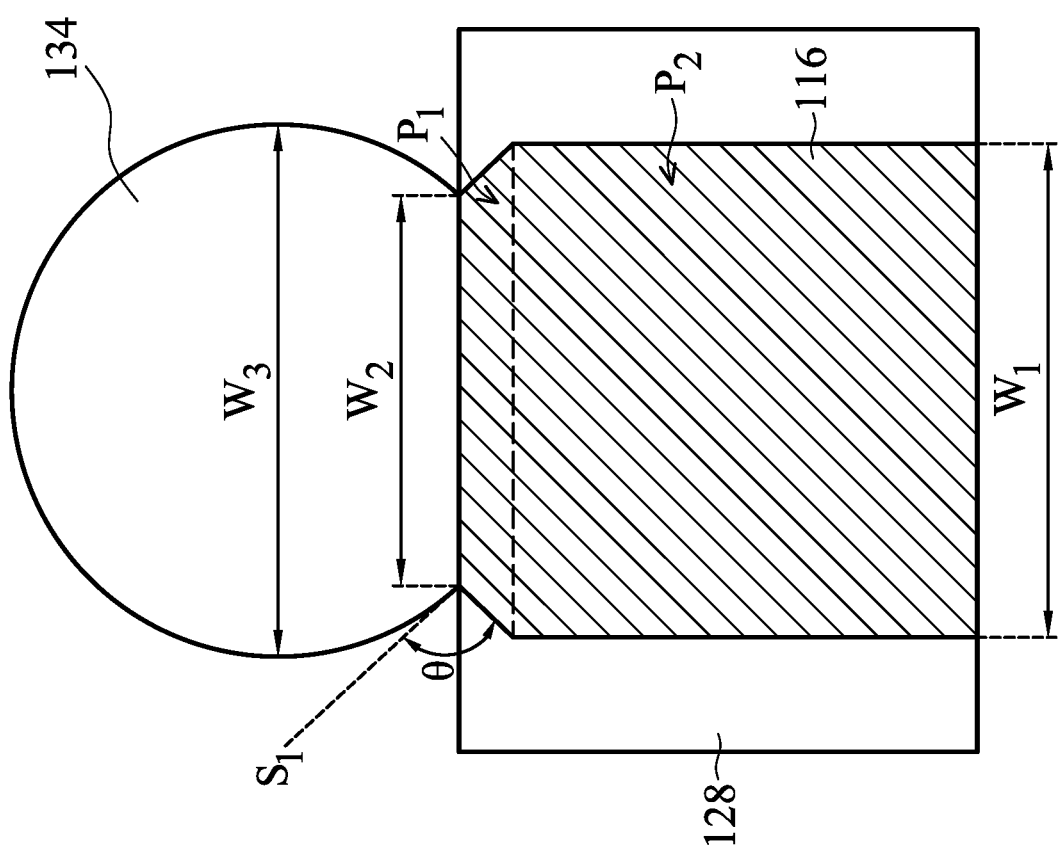
FIG. 2 is a cross-sectional view of a portion of a package structure, in accordance with some embodiments.

FIG. 2 is a cross-sectional view of a portion of a package structure, in accordance with some embodiments. In some embodiments, FIG. 2 is an enlarged cross-sectional view partially showing the structure shown in FIG. 1K. In FIG. 2, the conductive bump 134, the conductive structure 116, and the protective layer 128 are shown.

As shown in FIG. 2, the conductive structure 116 has a first portion $P_1$ and a second portion $P_2$. The first portion $P_1$ is between the second portion $P_2$ and the conductive bump 134. In some embodiments, the second portion $P_2$ is wider than the first portion $P_1$.

In some embodiments, the second portion $P_2$ has a substantially vertical sidewall surface. The second portion $P_2$ has a width $W_1$. The width $W_1$ may be in a range from about 100 μm to about 300 μm. In some embodiments, the first portion $P_1$ has an inclined sidewall surface. In some embodiments, the first portion $P_1$ shrinks along a direction towards the conductive bump 134. In some embodiments, the bottom of the first portion $P_1$ is substantially as wide as the second portion $P_2$. In some embodiments, the first portion $P_1$ shrinks gradually from a first part with the width $W_1$ to a second part with a width $W_2$ along a direction from the bottom of the first portion $P_1$ towards the top of the first portion $P_1$, as shown in FIG. 2. The width $W_2$ may be in a range from about 90 μm to about 290 μm. The width $W_2$ may be the shortest width of the first portion $P_1$ of the conductive structure 116. The width $W_2$ may be the width of the top end of the conductive structure 116. The conductive bump 134 has a width $W_3$. The width $W_3$ may be the widest width of the conductive bump 134. In some embodiments, the width $W_3$ is greater than the width $W_2$. The width $W_3$ may be in a range from about 100 μm to about 320 μm.

The ratio ($W_2/W_1$) of the width $W_2$ to the width $W_1$ may be in a range from about 0.5 to about 0.9. The sidewall surface of the first portion $P_1$ and a symbolic tangent line $S_1$ to a surface of the conductive bump 134 at an intersection of the first portion $P_1$ and the conductive bump 134 form an angle θ. In some embodiments, the angle θ is in a range from about 30 degrees to about 110 degrees. In some other embodiments, the angle θ is in a range from about 60 degrees to about 100 degrees.

Because the first portion $P_1$ shrinks, the edge of the interface between the conductive structure 116 and the conductive bump 134 is misaligned with the main sidewall surface of the conductive structure 116 (i.e., the sidewall surface of the second portion $P_2$). Therefore, the stress from the conductive bump 134 is prevented from directly reaching the main sidewall surface of the conductive structure 116 that is adjacent to the protective layer 128. The likelihood of delamination between the conductive structure 116 and the protective layer 128 is significantly reduced. In some other cases, if the conductive structure 116 does not have the shrunk portion adjacent to the conductive bump 134, the edge of the interface between the conductive structure 116 and the conductive bump 134 is substantially aligned with the main sidewall surface of the conductive structure 116. The stress may directly affect the main sidewall surface of the conductive structure 116. Delamination may occur between the conductive structure 116 and the protective layer 128.

Figure 1L:
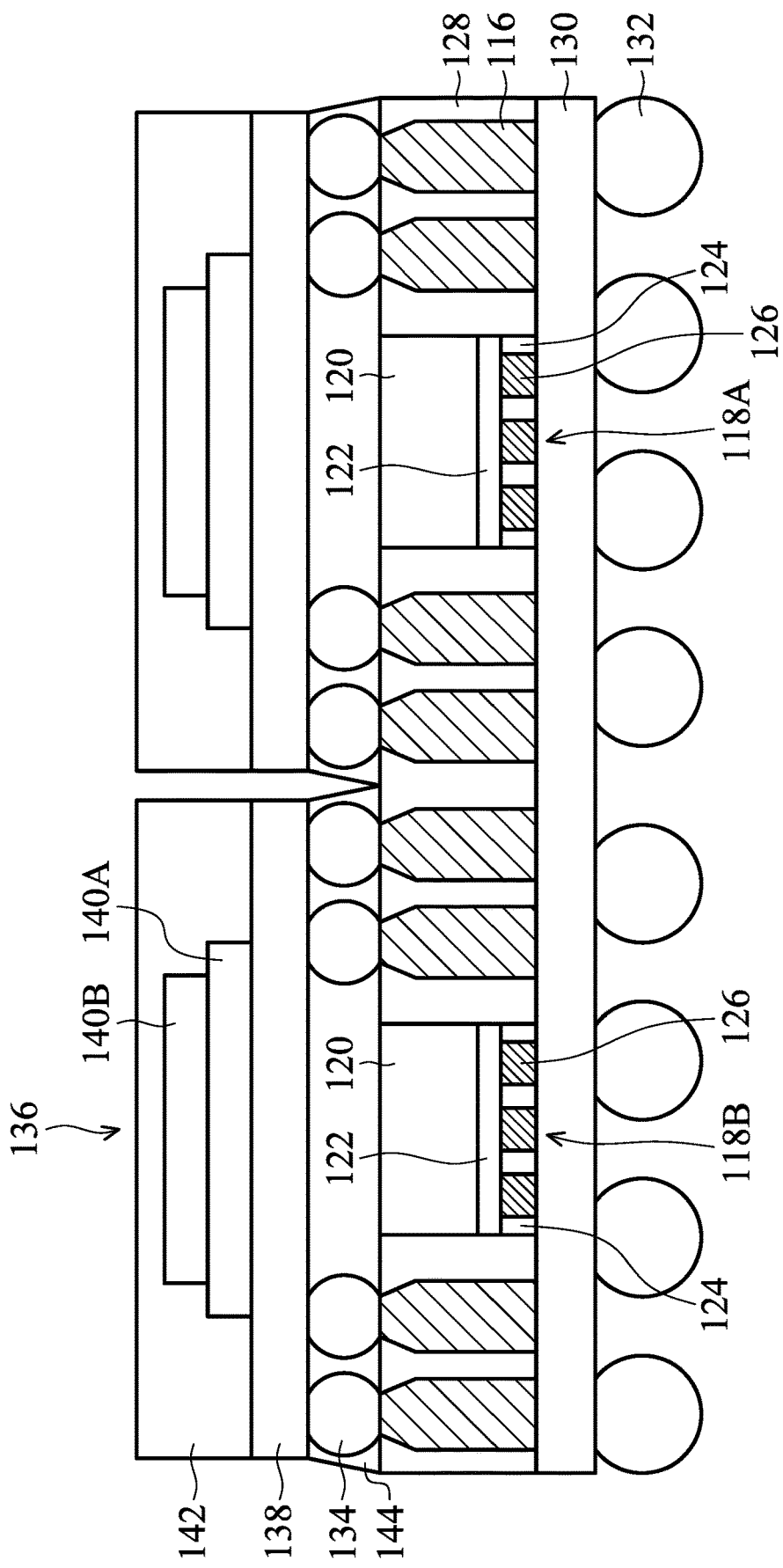

As shown in FIG. 1L, packages 136 are stacked onto the structure shown in FIG. 1K, in accordance with some embodiments. Each of the packages 136 may include a redistribution substrate 138, one or more semiconductor dies such as semiconductor dies 140A and 140B, and a protective layer 142 surrounding and protecting the semiconductor dies 140A and 140B. The material and formation method of the protective layer 142 may be the same as or similar to those of the protective layer 128.

Like the redistribution structure 130, the redistribution substrate 138 may include one or more insulating layers and multiple conductive features. Each of the device elements in the semiconductor dies 140A and 140B may be electrically connected to one or more of the conductive features in the redistribution substrate 138. For example, bonding wires may be used to form electrical connections therebetween. Electrical connections between the semiconductor die 118A (or 118B) and the semiconductor dies 140A and 140B may be formed through the redistribution substrate 138, the conductive bumps 134, the conductive structures 116, and the redistribution structure 130. In some embodiments, underfill elements 144 are formed to surround and protect the conductive bumps. In some embodiments, the redistribution substrate 138 is an interposer substrate.

In some embodiments, the stacking of the packages 136 involves applying compressive force on the conductive bumps 134. In some embodiments, a thermal compression process is used to bond the packages 136 to the conductive bumps 134. As mentioned earlier, the edge of the interface between the conductive structure 116 and the conductive bump 134 is misaligned with the main sidewall surface of the conductive structure 116 (i.e., the sidewall surface of the second portion P2). Therefore, the stress caused by the thermal compression process is prevented from directly concentrating at the main sidewall surface of the conductive structure 116. The likelihood of delamination between the conductive structure 116 and the protective layer 128 is significantly reduced or prevented.

Figure 1M:
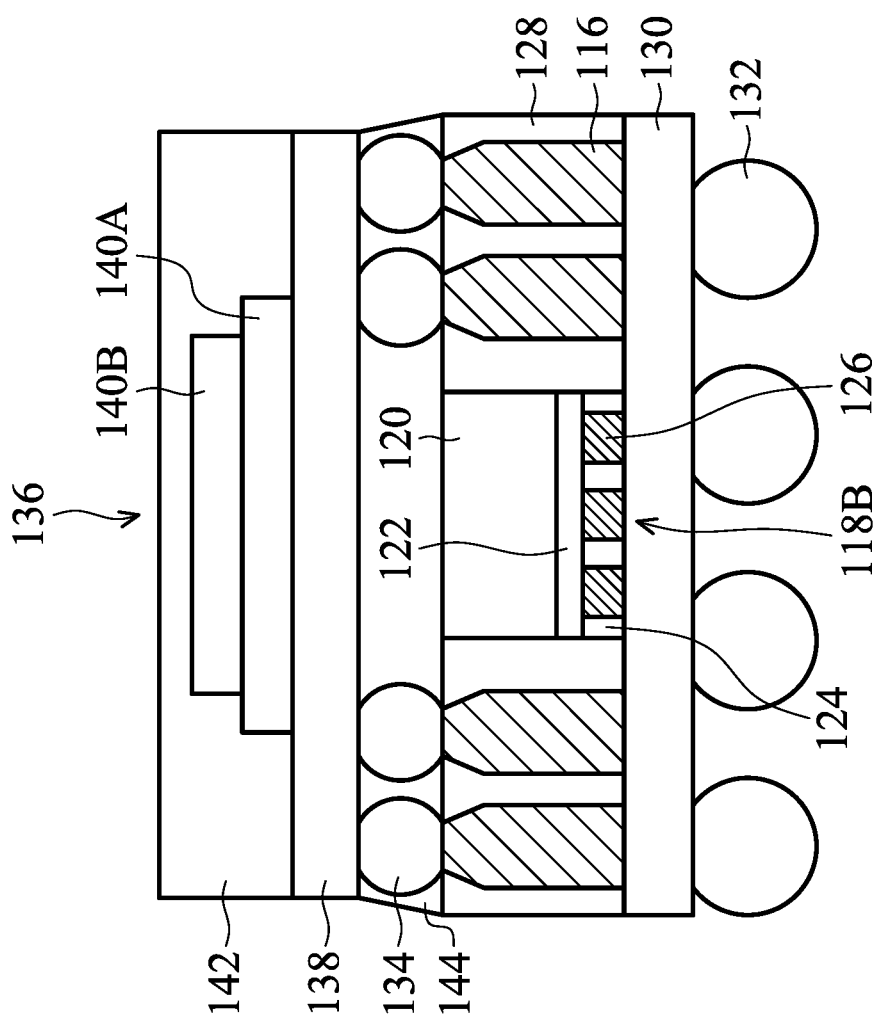

Afterwards, a sawing process is used to cut through the structure shown in FIG. 1L into multiple separate package structures. One of the package structures is shown in FIG. 1M in accordance with some embodiments.

Figure 3:
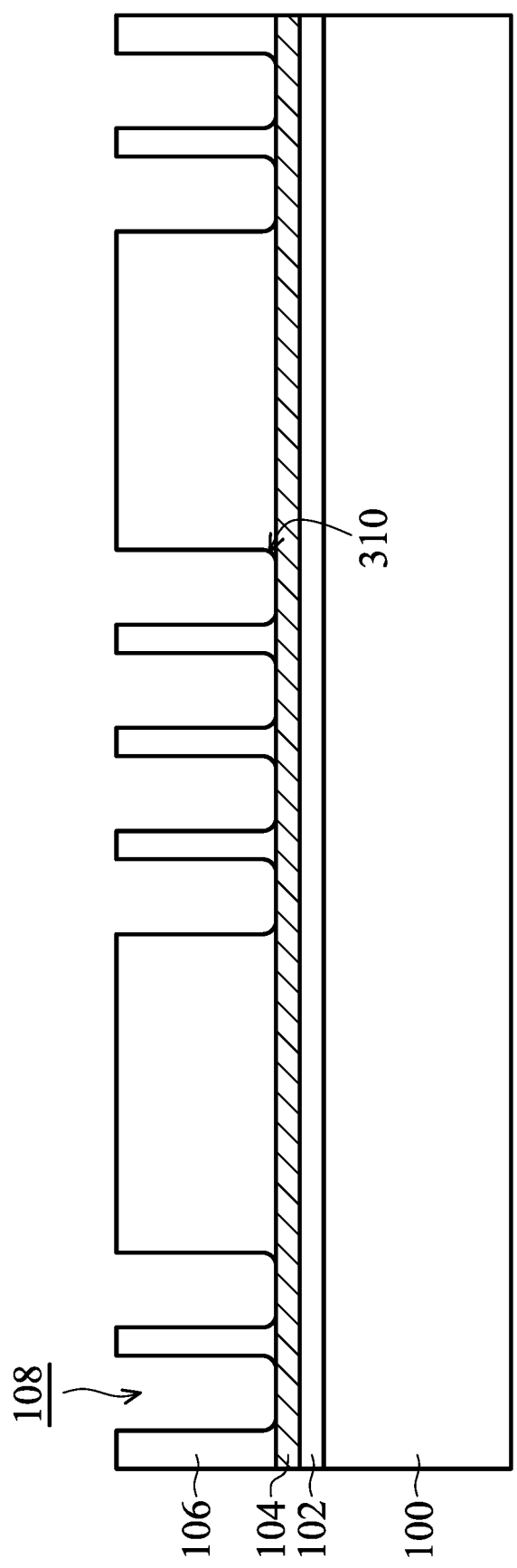
FIG. 3 is a cross-sectional view of a stage of a process for forming a package structure, in accordance with some embodiments.

Many variations and/or modifications can be made to embodiments of the disclosure. FIG. 3 is a cross-sectional view of a stage of a process for forming a package structure, in accordance with some embodiments. In some embodiments, the photosensitive layer 106 has footing structures 310 that have curved surfaces, as shown in FIG. 3. In some embodiments, each of the footing structures 310 has a concave surface facing upwards. The exposure operation and/or the development operation for forming the openings 108 may be fine-tuned to adjust the profiles of the footing structures 310.

Figure 4:
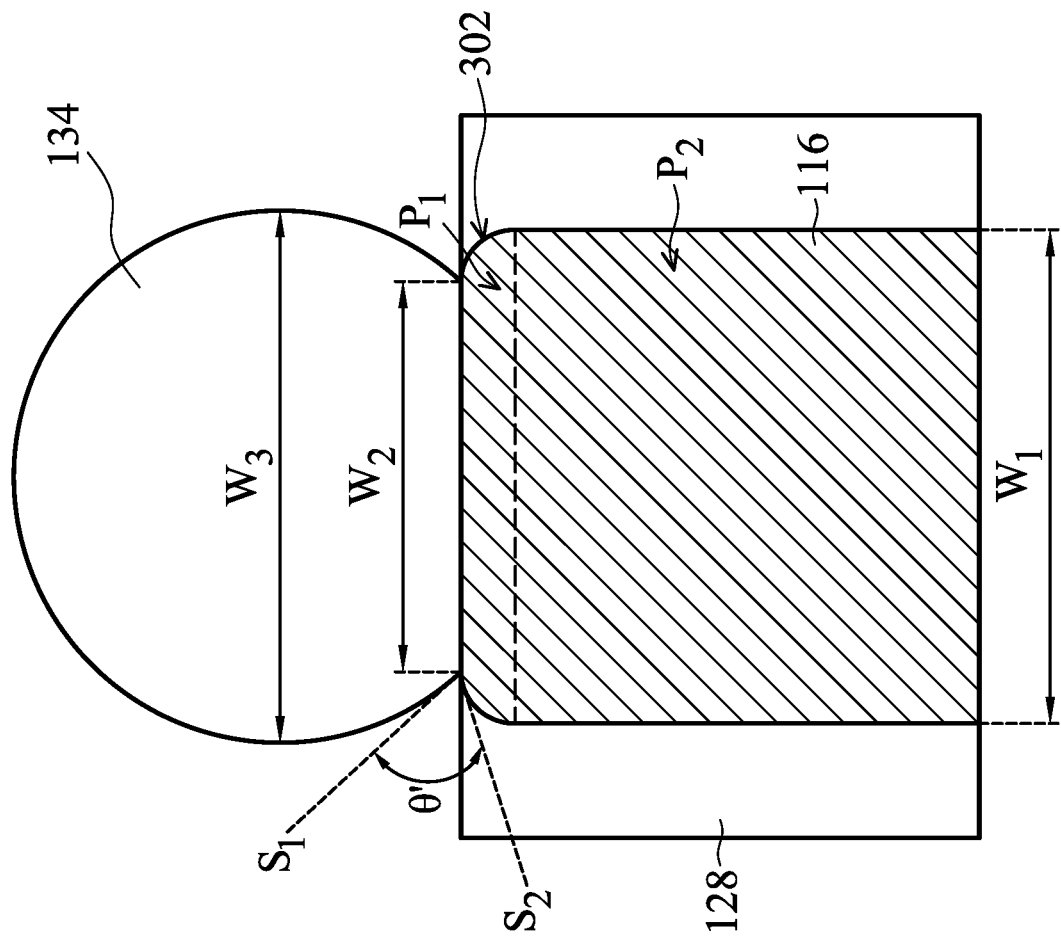
FIG. 4 is a cross-sectional view of a portion of a package structure, in accordance with some embodiments.

Many variations and/or modifications can be made to embodiments of the disclosure. FIG. 4 is a cross-sectional view of a stage of a process for forming a package structure, in accordance with some embodiments. In some embodiments, processes the same as or similar to those illustrated in FIGS. 1C-1K are performed on the structure shown in FIG. 3. As a result, a structure similar to the structure shown in FIG. 1K is formed. In some embodiments, FIG. 4 is an enlarged cross-sectional view partially showing the structure. In FIG. 4, the conductive bump 134, the conductive structure 116, and the protective layer 128 are shown.

As shown in FIG. 4, the conductive structure 116 has a first portion $P_1$ and a second portion $P_2$. The first portion $P_1$ is between the second portion $P_2$ and the conductive bump 134. In some embodiments, the second portion $P_2$ is wider than the first portion $P_1$.

In some embodiments, the second portion $P_2$ has a substantially vertical sidewall surface. In some embodiments, the first portion $P_1$ has a curved sidewall surface 302. In some embodiments, the curved sidewall surface 302 is a convex surface facing upwards. In some embodiments, the first portion $P_1$ shrinks along a direction towards the conductive bump 134. In some embodiments, the first portion $P_1$ gradually shrinks along a direction towards the conductive bump 134.

The symbolic tangent line $S_2$ of the curved sidewall surface 302 of the first portion $P_1$ and the symbolic tangent line $S_1$ of the conductive bump 134 form an angle θ'. In some embodiments, the angle θ' is in a range from about 30 degrees to about 110 degrees. In some other embodiments, the angle θ' is in a range from about 60 degrees to about 100 degrees.

Because the first portion $P_1$ shrinks, the edge of the interface between the conductive structure 116 and the conductive bump 134 is misaligned with the main sidewall surface of the conductive structure 116 (i.e., the sidewall surface of the second portion $P_2$). Therefore, the stress from the conductive bump 134 is prevented from directly reaching the main sidewall surface of the conductive structure 116 that is adjacent to the protective layer 128. The likelihood of delamination between the conductive structure 116 and the protective layer 128 is significantly reduced. In some other cases, if the conductive structure 116 does not have the shrunk portion adjacent to the conductive bump 134, the edge of the interface between the conductive structure 116 and the conductive bump 134 is substantially aligned with the main sidewall surface of the conductive structure 116. The stress may directly affect the main sidewall surface of the conductive structure 116. Delamination may occur between the conductive structure 116 and the protective layer 128.

Embodiments of the disclosure form a package structure including a conductive structure, a conductive bump over the conductive structure, and a protective layer surrounding the conductive structure. The conductive structure has a shrunk portion near the conductive bump. The shrunk portion has an inclined surface or a curved surface. Due to the profile of the shrunk portion, the stress from the conductive bump is prevented from directly reaching the main sidewall surface of the conductive structure that is adjacent to the protective layer. The likelihood of delamination between the conductive structure and the protective layer is therefore significantly reduced. The performance and reliability of the package structure are greatly improved.

In accordance with some embodiments, a method for forming a package structure is provided. The method includes forming a conductive structure over a carrier substrate. The conductive structure has a lower portion and an upper portion, and the upper portion is wider than the lower portion. The method also includes disposing a semiconductor die over the carrier substrate. The method further includes forming a protective layer to surround the conductive structure and the semiconductor die. In addition, the method includes forming a conductive bump over the conductive structure. The lower portion of the conductive structure is between the conductive bump and the upper portion of the conductive structure.

In accordance with some embodiments, a method for forming a package structure is provided. The method includes forming a conductive structure, and a lower portion of the conductive structure shrinks along a direction towards a bottom of the conductive structure. The method also includes disposing a semiconductor die beside the conductive structure. The method further includes forming a protective layer to surround the conductive structure and the semiconductor die. In addition, the method includes forming a conductive bump over the bottom of the conductive structure.

In accordance with some embodiments, a package structure is provided. The package structure includes a conductive structure and a semiconductor die laterally separated from each other. The package structure also includes a protective layer surrounding the conductive structure and the semiconductor die. The package structure further includes a conductive bump electrically connected to the conductive structure. The conductive structure has a first portion and a second portion, the first portion is between the conductive bump and the second portion, and the second portion is wider than the first portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a package structure, comprising:
    forming a conductive structure over a carrier substrate, wherein the conductive structure has a lower portion and an upper portion, and the upper portion is wider than the lower portion;
    disposing a semiconductor die over the carrier substrate;
    forming a protective layer to surround the conductive structure and the semiconductor die, wherein bottommost surfaces of the protective layer and the lower portion of the conductive structure are level with each other, the lower portion of the conductive structure has a sidewall extending from the upper portion to the bottommost surface of the conductive structure, and the protective layer is formed to be in direct contact with an entirety of the sidewall of the lower portion; and
    forming a conductive bump over the conductive structure, wherein the lower portion of the conductive structure is between the conductive bump and the upper portion of the conductive structure.

2. The method for forming a package structure as claimed in claim 1, wherein forming the conductive structure over the carrier substrate further comprises:
    forming a seed layer over the carrier substrate;
    forming a photosensitive layer over the seed layer;
    forming an opening in the photosensitive layer to expose a portion of the seed layer using an exposure operation and a development operation; and
    filling at least a portion of the opening with a conductive material to form the conductive structure.

3. The method for forming a package structure as claimed in claim 2, further comprising performing a plasma operation on the photosensitive layer prior to forming the conductive structure.

4. The method for forming a package structure as claimed in claim 3, wherein an operation temperature of the method is maintained after the plasma operation and before the formation of the conductive structure.

5. The method for forming a package structure as claimed in claim 2, wherein an operation temperature is maintained after the formation of the opening and before the formation of the conductive structure.

6. The method for forming a package structure as claimed in claim 2, further comprising removing the photosensitive layer after the conductive structure is formed.

7. The method for forming a package structure as claimed in claim 6, further comprising partially removing the seed layer after the photosensitive layer is removed.

8. The method for forming a package structure as claimed in claim 2, wherein the photosensitive layer has a footing structure near a bottom of the opening.

9. The method for forming a package structure as claimed in claim 1, wherein the protective layer is formed to be in direct contact with the upper portion of the conductive structure.

10. The method for forming a package structure as claimed in claim 1, wherein the conductive structure is formed using an electroplating process.

11. A method for forming a package structure, comprising:
    forming a seed layer over a carrier substrate;
    forming a photosensitive layer over the seed layer;
    forming an opening in the photosensitive layer to partially expose the seed layer;
    forming a conductive material on the seed layer exposed by the opening, wherein the conductive material forms a conductive structure, wherein a lower portion of the conductive structure shrinks along a direction towards a bottom of the conductive structure;
    performing a plasma operation on the photosensitive layer before the conductive material is formed;
    disposing a semiconductor die beside the conductive structure;
    forming a protective layer to surround the conductive structure and the semiconductor die, wherein the protective layer laterally surrounds a sidewall of the lower portion of the conductive structure; and
    forming a conductive bump over the bottom of the conductive structure, wherein the bottom of the conductive structure is between the conductive bump and a top of the conductive structure.

12. The method for forming a package structure as claimed in claim 11, wherein there is no thermal baking operation performed after the plasma operation and before the formation of the conductive material.

13. The method for forming a package structure as claimed in claim 11, further comprising removing the carrier substrate to expose the bottom of the conductive structure before the conductive bump is formed, wherein the conductive bump is formed directly on the bottom of the conductive structure.

14. The method for forming a package structure as claimed in claim 11, wherein the protective layer is in direct contact with the sidewall of the lower portion of the conductive structure.

15. A package structure, comprising:
   a conductive structure and a semiconductor die laterally separated from each other;
   a protective layer surrounding the conductive structure and the semiconductor die; and
   a conductive bump electrically connected to the conductive structure, wherein the conductive structure has a first portion and a second portion, the first portion is between the conductive bump and the second portion, the second portion is wider than the first portion, the first portion of the conductive structure is laterally surrounded by the protective layer, bottommost surfaces of the protective layer and the second portion of the conductive structure are level with each other, the first portion of the conductive structure has a sidewall extending from the second portion to the bottommost surface of the conductive structure, and the protective layer is formed to be in direct contact with an entirety of the sidewall of the first portion.

16. The package structure as claimed in claim 15, wherein the first portion of the conductive structure has an inclined sidewall surface.

17. The package structure as claimed in claim 15, wherein the first portion of the conductive structure has a curved sidewall surface.

18. The package structure as claimed in claim 15, wherein a sidewall surface of the first portion of the conductive structure and a symbolic tangent line of the conductive bump adjacent to the conductive structure forms an angle, and the angle is in a range from about 30 degrees to about 110 degrees.

19. The package structure as claimed in claim 15, wherein the first portion of the conductive structure has a first width, the second portion of the conductive structure has a second width, and a ratio of the first width to the second width is in a range from about 0.5 to about 0.9.

20. The package structure as claimed in claim 15, wherein the conductive bump is in direct contact with the conductive structure.

* * * * *